(12) United States Patent
Eun

(10) Patent No.: US 7,608,910 B2
(45) Date of Patent: Oct. 27, 2009

(54) SEMICONDUCTOR ESD DEVICE AND METHODS OF PROTECTING A SEMICONDUCTOR DEVICE

(75) Inventor: Hyung-Lae Eun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 494 days.

(21) Appl. No.: 11/366,457

(22) Filed: Mar. 3, 2006

(65) Prior Publication Data
US 2007/0029638 A1    Feb. 8, 2007

(30) Foreign Application Priority Data
Aug. 5, 2005    (KR) .................. 10-2005-0071689

(51) Int. Cl.
*H01L 23/00*    (2006.01)
*H01L 23/52*    (2006.01)
*H01L 23/525*    (2006.01)

(52) U.S. Cl. ............... 257/529; 257/209; 257/E23.002; 257/E23.134; 257/E23.15; 257/E27.07; 438/128; 438/132

(58) Field of Classification Search .......... 257/E29.015, 257/529, 209, E23.002, E23.134, E23.15, 257/E27.07; 360/313, 323; 438/128, 132
See application file for complete search history.

(56) References Cited

U.S. PATENT DOCUMENTS 5,223,444 A * 6/1993 Mosser et al. ................. 438/53
6,943,302 B2 * 9/2005 Kageyama et al. ........... 174/254
2002/0079552 A1 * 6/2002 Koike ........................... 257/529
2005/0161766 A1 * 7/2005 Sato et al. .................... 257/529
2006/0214260 A1 * 9/2006 Cho et al. ..................... 257/529

FOREIGN PATENT DOCUMENTS

| JP | 07-078872 | 3/1995 |
| JP | 11-163287 | 6/1999 |
| JP | 2002-184869 | 6/2002 |
| KR | 10-2003-0073378 | 9/2003 |

* cited by examiner

*Primary Examiner*—M. Wilczewski
*Assistant Examiner*—Tsz K Chiu
(74) *Attorney, Agent, or Firm*—Harness, Dickey & Pierce, P.L.C.

(57) ABSTRACT

A semiconductor device and methods for protecting a semiconductor device. In an example, the semiconductor device may include a semiconductor substrate including at least one electrostatic discharge (ESD) protection device, at least one metal interconnection line connected to the at least one ESD protection device through a conductive plug and a passivation layer disposed on less than all of the metal interconnection line. In an example method, a semiconductor device may be protected by diverting at least a portion of an electron build-up from an accumulation point to one or more protective circuits along one or more conductive paths, the electron build-up, without the diverting, sufficient to cause an ESD at the accumulation point. In another example, a semiconductor device may be protected by exposing one or more conductive lines to a fuse opening to avoid an ESD by diverting an electron build-up at the fuse opening to one or more ESD protection devices.

16 Claims, 5 Drawing Sheets

SEMICONDUCTOR ESD DEVICE AND METHODS OF PROTECTING A SEMICONDUCTOR DEVICE

PRIORITY STATEMENT

This application claims benefit of priority under 35 USC § 119 from Korean Patent Application No. 10-2005-0071689, filed on Aug. 5, 2005, in the Korean Intellectual Property Office, the contents of which are incorporated herein by reference in its entirety.

BACKGROUND OF THE INVENTION

1. Field of the Invention

Example embodiments of the present invention relate generally to a semiconductor device and methods thereof, and more particularly to a semiconductor device and methods of protecting a semiconductor device.

2. Description of the Related Art

Electrostatic discharge (ESD) may be generated when a semiconductor device comes into contact with and/or is placed adjacent to an article charged with an electrostatic potential different from the electrostatic potential of the semiconductor device. EDS may be characterized by a greater amount of charges being delivered to the semiconductor device within a shorter period of time period (e.g., less than 1 micro-second (μs)), such that an instant voltage and/or current "spike" may be generated inside the semiconductor device. The instant voltage and/or current spike may exceed an operation threshold of the semiconductor device, may damage a gate insulator of the semiconductor device and may accelerate an electro-thermal failure, such as a contact spike, a melting of silicon, a breaking of wiring, etc. Accordingly, conventional semiconductor devices may include ESD protection circuits in an attempt to reduce the harmful effects of ESD. For example, an ESD protection circuit may be employed at an input terminal of a semiconductor device to protect against ESDs received from an external source.

During a semiconductor fabrication process, charges generated by plasma (e.g., used for gate etching, metal interconnection line etching, photoresist stripping, etc.) may accumulate (e.g., on a gate pattern, a metal interconnection line pattern, etc.).

FIG. 1 is a schematic sectional view illustrating a conventional semiconductor device 100 including a diode for protecting against an ESD.

Referring to FIG. 1, when electrons associated with plasma used in a plasma etching process for forming a metal interconnection line accumulate on a gate conductive layer 17 through a via 32 formed in a metal interconnection line 50 and an insulation layer 60, an ESD may be generated. The generated ESD may damage a gate insulating layer 15. The semiconductor device 100 may be protected against such damage by allowing the current generated due to the ESD to flow through an ESD protection circuit.

Referring to FIG. 1, an N-type impurity region 12 may be formed in a P-type semiconductor substrate 10 to form an NP junction diode. FIG. 2 illustrates a circuit diagram of the NP junction diode of FIG. 1. In an example, the NP junction diode of FIGS. 1 and 2 may function as an ESD protection circuit.

Referring to FIGS. 1 and 2, the metal interconnection line 50 may be connected to the N-type impurity region 12 through a conductive plug 34. If the current generated by the ESD flows through the NP junction diode including the N-type impurity region 12 from the metal interconnection line 50, the semiconductor device 100 may be protected or isolated from the ESD.

Referring to FIG. 1, the ESD may be generated during a packing process after the fabrication process of the semiconductor device 100 is completed. A polyimide layer of a fuse region may be opened in order to cut a fuse connected to a failed cell by irradiating a laser beam and the failed cell may thereafter be replaced with a redundancy cell. In an example, the ESD may be generated during the packing process at a position where the polyimide layer may open.

FIG. 3 illustrates a fuse opening 25 exposing a fuse part and a section of a semiconductor device having an ESD protection device and an accumulation of ESD generated at the region where the fuse part is opened.

Referring to FIG. 3, the N-type impurity region 12 may be positioned in a P-type semiconductor substrate 10 to form an ESD protection circuit or ESD protection junction diode. A first metal interconnection line 40 and a second metal interconnection line 50 may be connected to the N-type impurity region 12 through conductive plugs 34 and 36, respectively. Accordingly, static electricity generated in the first and second metal interconnection lines 40 and 50 may be discharged through the ESD protection junction diode in order to protect the semiconductor device.

Referring to FIG. 3, the static electricity charge that may be generated during a number of processes (e.g., an opening process of a polyimide layer 80 of a fuse region, a packing process, etc.) may accumulate on a fuse protecting layer 65 on a fuse 20 as well as on the polyimide layer 80 and a passivation layer 70. The ESD protection junction diode may not be able to protect the semiconductor device 100 from the collective ESD accumulated on the polyimide layer 80, the passivation layer 70 and the fuse 20. Since the charge of the polyimide layer 80 may be isolated from the second metal interconnection line 50 by the passivation layer 70, the charge may not flow through the ESD protection junction diode connected with the second metal interconnection line 50. Further, since the charges on the fuse 20 and the passivation layer 70 may not have discharge paths, the charges on the fuse 20 and the passivation layer 70 may likewise not flow through the ESD protection junction diode.

FIG. 4A is a plane photograph illustrating a fuse part of a region where the polyimide layer is opened when the fuse part is receiving an ESD. Referring to FIG. 4A, a reference numeral "1" may indicate that a passivation layer may be pierced by the ESD and a reference numeral "2" may indicate that the fuse part may be damaged by the ESD flowing through the gap (e.g., reference numeral "1") of the passivation layer.

FIG. 4B is a sectional photograph illustrating an inclined portion of a metal interconnection line damaged due to an ESD generated in positions corresponding to open portions of the polyimide layer. Referring to FIG. 4B, a reference numeral "3" may indicate a plurality of melted portions (e.g., melted by an ESD) of the passivation layer on the metal interconnection line. Although FIGS. 4A and 4B illustrate damaged portions of the fuse and the metal interconnection line, other parts (e.g., a lower structure of the semiconductor device, such as a gate insulating layer) may also be damaged due to the ESD. For example, ESDs may occur frequently at an edge of the opened region of the polyimide layer (e.g., a portion to which an electric field may be strongly applied due to a thin insulating layer or passivation layer).

FIG. 5 is a photograph illustrating an opened portion of the polyimide layer on a fuse part. Referring to FIG. 5, the polyimide layer may have an opening with a rectangular shape. An electric charge may accumulate on an edge 4 of the polyimide layer around the rectangular opening such that damage due to an ESD may occur substantially on a thinner portion of the passivation layer.

SUMMARY OF THE INVENTION

An example embodiment of the present invention is directed to a semiconductor device, including a semiconductor substrate including at least one electrostatic discharge (ESD) protection device, at least one metal interconnection line connected to the at least one ESD protection device through a conductive plug and a passivation layer disposed on less than all of the at least one metal interconnection line.

Another example embodiment of the present invention is directed to a method of protecting a semiconductor device, including diverting at least a portion of an electron build-up from an accumulation point to one or more protective circuits along one or more conductive paths, the electron build-up, without the diverting, sufficient to cause an ESD at the accumulation point.

Another example embodiment of the present invention is directed to a method of protecting a semiconductor device, including exposing one or more conductive lines to a fuse opening to avoid an ESD by diverting an electron build-up at the fuse opening to one or more ESD protection devices.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE INVENTION

Figure 1:
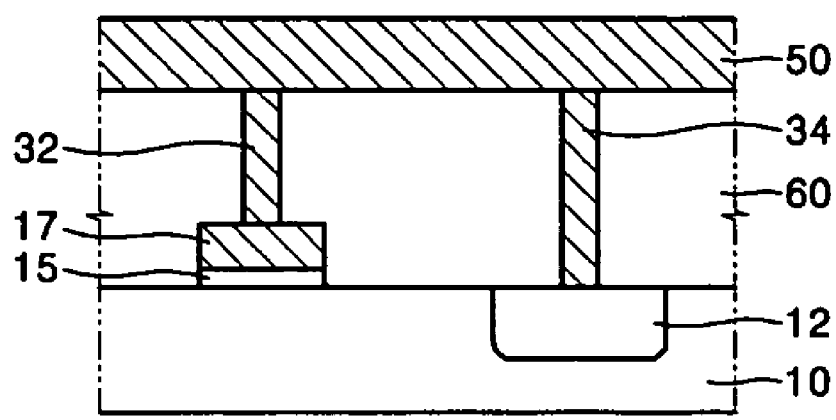
FIG. 1 is a schematic sectional view illustrating a conventional semiconductor device including a diode for protecting against an electrostatic discharge (ESD).
Figure 2:
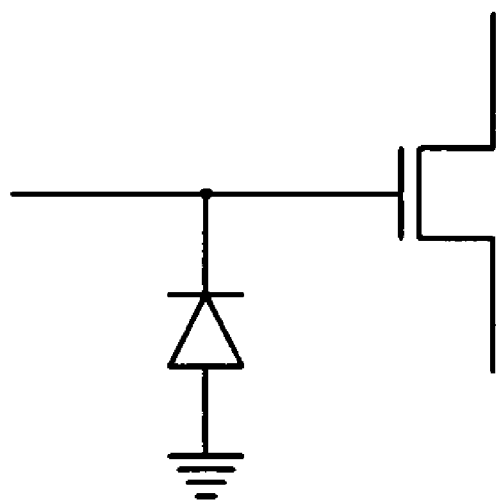
FIG. 2 illustrates a circuit diagram of a conventional NP junction diode.
Figure 3:
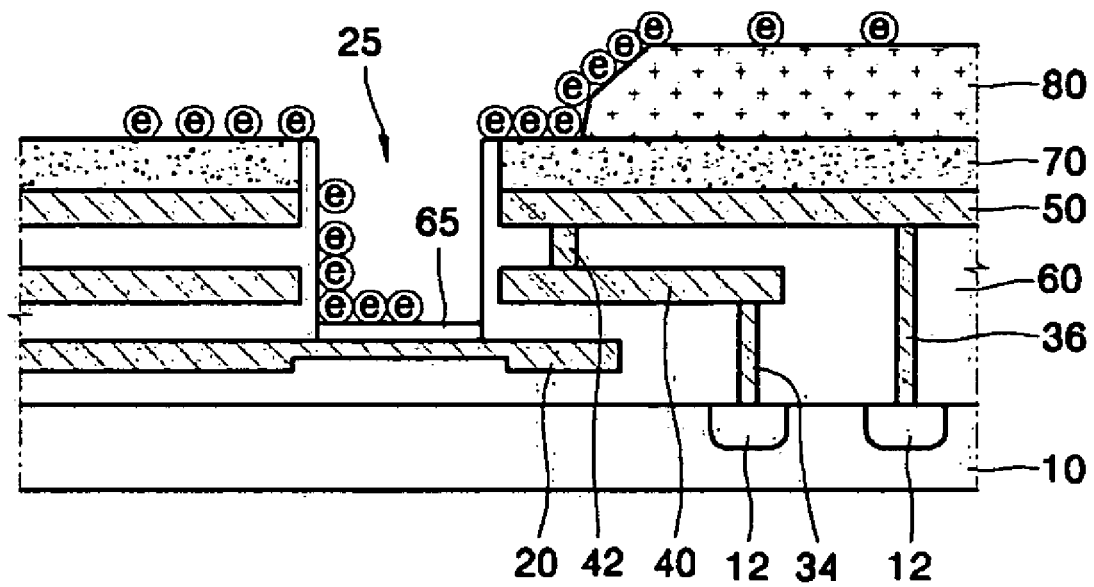
FIG. 3 illustrates a conventional fuse opening exposing a fuse part and a section of a semiconductor device having an ESD protection device and an accumulation of ESD generated at the region where the fuse part is opened.
Figure 4A:
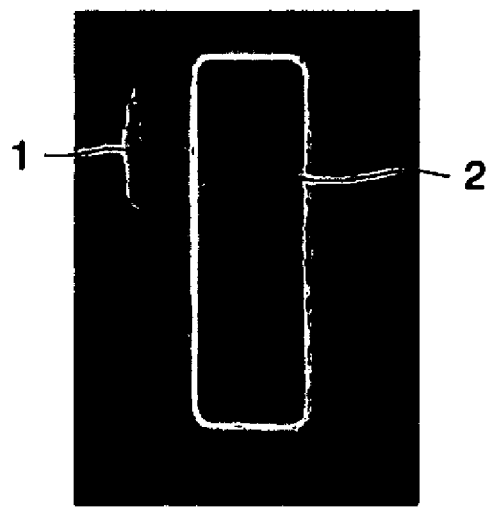
FIG. 4A is a plane photograph illustrating a conventional fuse part of a region where a polyimide layer is opened when the fuse part is receiving an ESD.
Figure 4B:
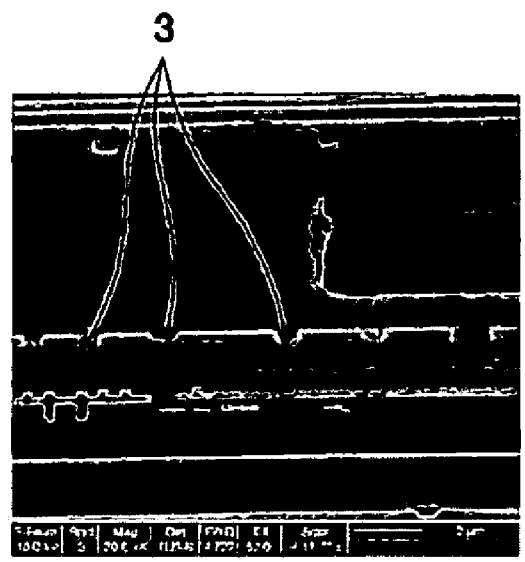
FIG. 4B is a sectional photograph illustrating an inclined portion of a metal interconnection line damaged due to an ESD generated in positions corresponding to open portions of a polyimide layer.
Figure 5:
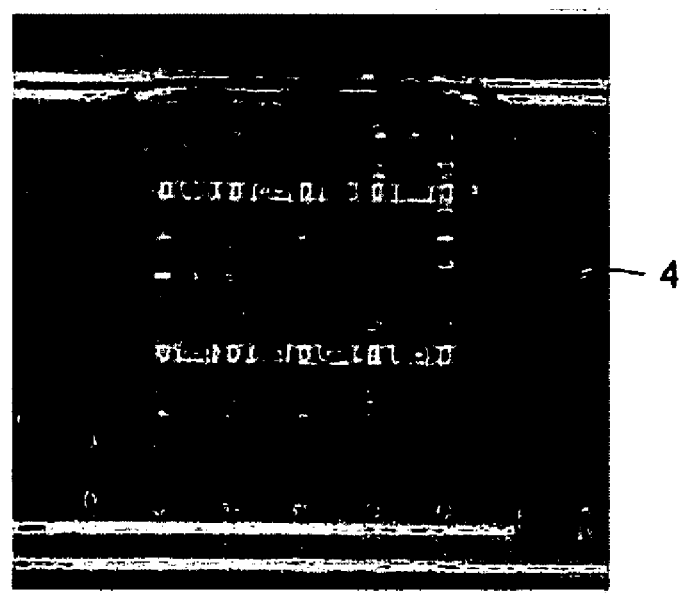
FIG. 5 is a photograph illustrating an opened portion of a conventional polyimide layer on a fuse part.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an example embodiment of the present invention, a polyimide layer may directly contact a metal interconnection line and/or a dummy metal pattern at a region corresponding to an "opening" of the polyimide layer. A semiconductor device including the polyimide layer may be at least partially protected from an electrostatic discharge (ESD) generated at or in proximity to the opening of the polyimide layer via at least one ESD protection circuit connected to the metal interconnection line and/or the dummy metal pattern. In an example, by localizing ESD protection at the opening of the polyimide layer, additional ESD protective measures need not be employed (e.g., because stopping the ESD at the opening of the polyimide layer may be sufficient to protect the semiconductor device). Further, in another example, a dummy fuse may be connected to an ESD protection circuit (e.g., engaged at the opening of the polyimide layer). In yet another example, the dummy fuse may be connected to the ESD protection circuit via a dummy metal pattern.

Hereinafter, additional example embodiments of the present invention will be described. While a junction diode formed in a semiconductor substrate may be described below as a construction of an ESD protection circuit, it is understood that a transistor formed in the semiconductor device may be used in place of and/or in combination with the junction diode in other example embodiments of the present invention.

Figure 6:
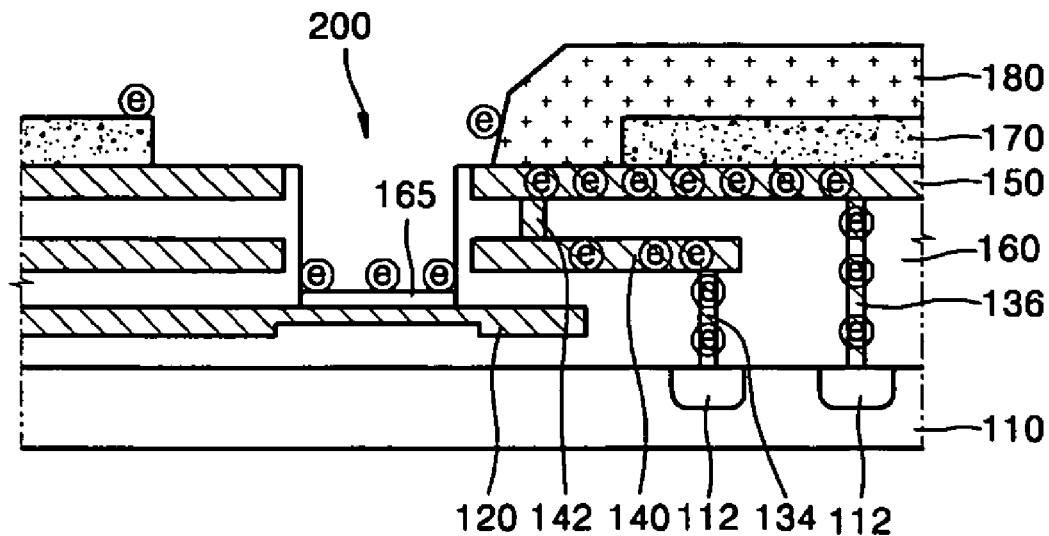
FIG. 6 is a sectional view of a semiconductor device including a fuse opening according to an example embodiment of the present invention.

FIG. 6 is a sectional view of a semiconductor device according to an example embodiment of the present invention.

In the example embodiment of FIG. 6, a polyimide layer 180 around a fuse opening 200 may be opened or exposed (e.g., not continuous). A fuse 120 may be exposed at a lower portion (e.g., a bottom) of the fuse opening 200. A fuse protecting layer 165 may be disposed on the fuse 120. In an example, the fuse 120 may be formed of at least one of polysilicon and metal (e.g., aluminum (Al), tungsten (W), etc.).

In the example embodiment of FIG. 6, a plurality of N-type impurity regions 112 may be formed in a P-type semiconductor substrate 110. The plurality of N-type impurity regions 112 and the P-type semiconductor substrate 110 may collectively form a plurality ESD protection junction diodes or protection circuits. A first metal interconnection line 140 and a second metal interconnection line 150 may be connected to the N-type impurity regions 112 through a first conductive plug 132 and a second conductive plug 134, respectively. The first metal interconnection line 140 and the second metal interconnection line 150 may be connected with each other with a via 142. In an example, the first metal interconnection line 140 and the second metal interconnection line 150 may include at least one of tungsten (W), aluminum (Al) and copper (Cu). An insulator 160 may be interposed between the semiconductor substrate 110 and the fuse 120, between the fuse 120 and the first metal interconnection line 140, and between the first and second metal interconnection lines 140 and 150.

In the example embodiment of FIG. 6, a passivation layer 170 may be disposed on the second metal interconnection line 150 so as to protect (e.g., isolate from a potential ESD) the second metal interconnection line 150. In an example, the passivation layer 170 may include silicon nitride. The passivation layer 170 may partially expose the second metal interconnection line 150. A polyimide layer 180 may be formed on the passivation layer 170 and the partially exposed portion of the second metal interconnection line 150. In an example, the polyimide layer 180 may include a photosensitive material.

In the example embodiment of FIG. 6, the polyimide layer 180 may have an opening (e.g., a non-continuous portion) proximate to (e.g., surrounding) the fuse opening 200. Charges (e.g., including electrons) may accumulate on an edge of the polyimide layer 180 around the fuse opening 200. Such charges may allow a higher voltage to be applied to a thinner portion of the passivation layer 170 at the opening of the polyimide layer 180, which may increase the probability that an ESD may be generated at the edge of the polyimide layer 180 (e.g., which may breach the passivation layer 170 and/or other components).

In the example embodiment of FIG. 6, the edge of the polyimide layer 180 (e.g., at the opening) may directly contact the second metal interconnection line 150. Charges accumulated on the polyimide layer 180 (e.g., at the edge near the opening) may flow through the ESD protection junction diode connected to the second metal interconnection line 150 by the contact between the polyimide layer 180 and the second metal interconnection line 150 such that the ESD defect may be reduced (e.g., prevented). Further, a current induced by the ESD may flow through a diode 112 via the second metal interconnection line 150, the via 142, the first metal interconnection line 140 and/or the first conductive plug 132. Accordingly, by using the ESD protection junction diode to protect the semiconductor device from a potential ESD (e.g., which may be generated during a plasma etching process and/or packing process), defects in a semiconductor device incurred during a semiconductor fabrication process may be reduced.

In another example embodiment of the present invention, referring to FIG. 6, if a metal interconnection line (e.g., metal interconnection line 140, 150, etc.) is not disposed around the fuse part 200 and the polyimide layer 180 is not in direct contact the metal interconnection line, a dummy metal pattern (e.g., a parallel or additional conductive path) may be disposed. In an example, the second metal interconnection line 150 of FIG. 6 may function as the dummy metal pattern. The dummy metal pattern (e.g., the second metal interconnection line 150) may be connected to the ESD protection junction diode (e.g., diode 112), and the semiconductor device may thereby be better protected from a potential ESD generated due to charges accumulated on the polyimide layer 180.

In another example embodiment of the present invention, referring to FIG. 6, a dummy fuse (e.g., connected to the dummy metal pattern) may be disposed at the fuse part 200 to increase protection against a potential ESD for the semiconductor device.

Figure 7:
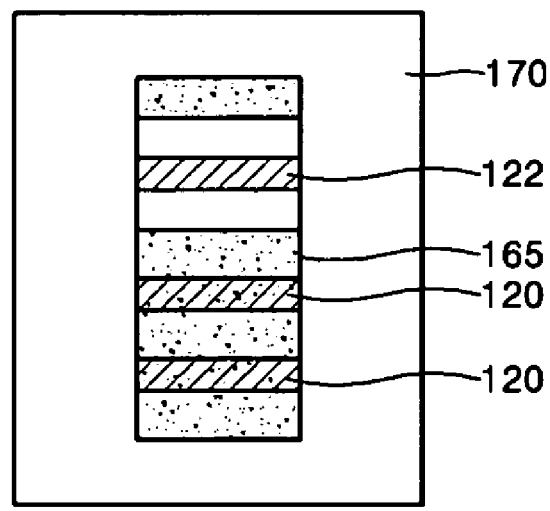
FIG. 7 is a plane view of the fuse opening of FIG. 6.

FIG. 7 is a plane view of the fuse opening 200 of FIG. 6. In the example embodiment of FIG. 7, a dummy fuse 122 may be disposed in the fuse part 200 along with additional fuses 120. In the fuse opening 200, while a fuse protecting layer 165 may be disposed on the additional fuses 120, the fuse protecting layer 165 may be removed, at least in part, from the upper surface of the dummy fuse 122 by forming an opening.

Figure 8:
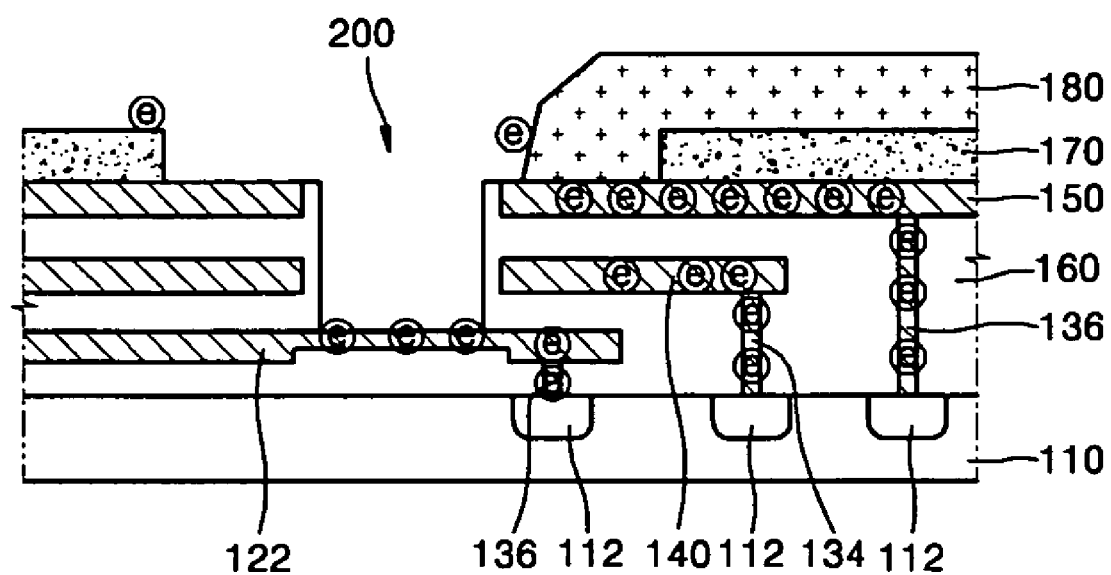
FIG. 8 is a schematic sectional view of a semiconductor device including a dummy fuse and a polyimide layer around a fuse opening according to another example embodiment of the present invention.

FIG. 8 is a schematic sectional view of a semiconductor device including a dummy fuse 122 and a polyimide layer 180 around a fuse opening according to another example embodiment of the present invention. The semiconductor device of FIG. 8 may be similar to the semiconductor device of FIG. 6 except that the fuse protecting layer 165 of FIG. 6 may not be included in the semiconductor device of FIG. 8 and the dummy fuse 122 may be connected to an N-type impurity region 112 through a third conductive plug 136. Accordingly, since the ESD due to the charges accumulated on the polyimide layer 180 may occur along the second metal interconnection line 150 through the ESD protection junction diode, the semiconductor device may be protected against potential ESDs and the occurrence of a defect in the semiconductor device due to an ESD caused by charges accumulated on the fuse protecting layer 165 may be reduced by the EDS protection junction diode connected through the dummy fuse 122.

In another example embodiment of the present invention, the passivation layer 170 formed on the second metal interconnection line 150 may be etched such that the second metal interconnection line 150 may be partially exposed around the fuse opening 200 (e.g., to collect or divert electrons from the fuse opening 200). Further, the polyimide layer may be formed such that the polyimide layer 180 may directly contact the partially exposed portion of the second metal interconnection line 150.

Example embodiments of the present invention being thus described, it will be obvious that the same may be varied in many ways. For example, while the above-described example embodiments of the present invention are directed generally to reducing defects caused by ESD during a semiconductor manufacturing process, it is understood that other example embodiments of the present invention may be directed to reducing damaging effects incurred by ESD at any point in the life of a semiconductor device (e.g., after fabrication).

Such variations are not to be regarded as departure from the spirit and scope of example embodiments of the present invention, and all such modifications as would be obvious to one skilled in the art are intended to be included within the scope of the following claims.

What is claimed is:

1. A semiconductor device, comprising:
    a semiconductor substrate including at least one electrostatic discharge (ESD) protection device;
    at least one insulating layer disposed on the semiconductor substrate;
    a fuse part including a plurality of fuses and a fuse protecting layer disposed on the plurality of fuses, the fuse part being disposed on the first insulating layer;
    at least one metal interconnection line connected to the at least one ESD protection device through a conductive plug; wherein the at least one metal interconnection line and a fuse opening are formed within the at least one insulating layer;
    a passivation layer disposed on an uppermost metal interconnection line of the at least one metal interconnection line, wherein the passivation layer exposes portions, adjacent to the fuse opening, of the uppermost metal interconnection line; and
    a device protective layer covering the exposed portions of the uppermost metal interconnection line, the passivation layer, an upper surface of the at least one insulating layer.

2. The semiconductor device of claim 1, wherein the at least one ESD protection device includes at least one of a diode and a transistor.

3. The semiconductor device of claim 1, wherein the plurality of fuses include at least one of polysilicon and metal.

4. The semiconductor device of claim 1, wherein the at least one metal interconnection line includes at least one of tungsten, aluminum and copper.

5. The semiconductor device of claim 1, wherein the at least one metal interconnection line includes a plurality of metal interconnection lines.

6. The semiconductor device of claim 5, wherein at least two of the plurality of metal interconnection lines are electrically connected with each other and further connected to a first ESD protection device and a second ESD protection device, respectively.

7. The semiconductor device of claim 1, wherein the passivation layer includes silicon nitride.

8. The semiconductor device of claim 1, wherein the device protection layer includes polyimide.

9. The semiconductor device of claim 1, wherein the at least one metal interconnecting line includes a dummy metal pattern connected to the at least one ESD protection device.

10. The semiconductor device of claim 1, wherein the fuse part includes a plurality of dummy fuses connected to the at least one ESD protection device.

11. The semiconductor device of claim 10, wherein:
    the fuse protecting layer is disposed only on the plurality of fuses, and an upper surface of the dummy fuses are exposed in the fuse opening.

12. The semiconductor device of claim 1, wherein the at least one metal interconnection line connects to at least one of a lower portion and upper portion of the fuse opening.

13. The semiconductor device of claim 12, wherein the at least one metal interconnection line includes a first metal interconnection line connected to the lower portion and a second metal interconnection line connected to the upper portion.

14. The semiconductor device of claim 13, wherein the second metal interconnection line is a dummy metal pattern.

15. The semiconductor device of claim 1, wherein the device protective layer directly contacts the exposed portions of the uppermost metal interconnection line.

16. The semiconductor device of claim 8, wherein the polyimide is a photosensitive polyimide.

* * * * *